United States Patent
Chen et al.

(10) Patent No.: US 6,576,479 B2
(45) Date of Patent: Jun. 10, 2003

(54) METHOD FOR FORMING VERTICAL FERROELECTRIC CAPACITOR COMPRISING FORMING FERROELECTRIC MATERIAL IN GAP BETWEEN ELECTRODES

(75) Inventors: Shue-Shuen Chen, Yunlin Hsien (TW); Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 23 days.

(21) Appl. No.: 09/839,210

(22) Filed: Apr. 23, 2001

(65) Prior Publication Data

US 2002/0155659 A1 Oct. 24, 2002

(51) Int. Cl.[7] .............................................. H01L 21/00
(52) U.S. Cl. ........................... 438/3; 438/240; 438/381; 438/957
(58) Field of Search ........................... 438/3, 239, 240, 438/250, 253, 243, 244, 381, 386, 387, 393, 396, 637–639, 957; 257/296, 301, 303, 306, 310, 532

(56) References Cited

U.S. PATENT DOCUMENTS 5,757,612 A * 5/1998 Acosta et al. ............ 361/321.4
6,033,919 A * 3/2000 Gnade et al. .................. 438/3

FOREIGN PATENT DOCUMENTS

JP    2000031394 A * 1/2000 ........... H01L/27/04

* cited by examiner

Primary Examiner—Matthew Smith
Assistant Examiner—Craig P. Lytle

(57) ABSTRACT

A vertical ferroelectric capacitor structure and the method of fabricating the same. An insulating layer is formed on a semiconductor substrate. A lower opening and an upper opening with the depth larger than the width are defined and formed in the insulating layer. A conductive material is filled into the openings to form two vertical and parallel plate electrodes to serve as lower electrode and upper electrode. A portion of the insulating layer between the lower and upper electrodes are then removed to form a gap between the lower and upper electrodes. A ferroelectric material is filled into the gap to form a ferroelectric capacitor with vertical structure.

19 Claims, 5 Drawing Sheets

METHOD FOR FORMING VERTICAL FERROELECTRIC CAPACITOR COMPRISING FORMING FERROELECTRIC MATERIAL IN GAP BETWEEN ELECTRODES

FIELD OF THE INVENTION

The present invention relates to a semiconductor technology, and more particularly to a ferroelectric capacitor having a vertical structure.

BACKGROUND OF THE INVENTION

In recent years, a nonvolatile ferroelectric memory cell and a ferroelectric random access memory (FRAM) having the foregoing memory cell array comprising, as an interelectrode insulation film of a capacitor for storing information, a ferroelectric thin film made of a material having a perovskite structure have attracted attention.

The ferroelectric film has a characteristic such that electric polarization generated once when an electric field has been applied is retained even if the electric field is removed and the direction of the polarization is inverted when an electric field having intensity exceeding a certain level is applied into a direction opposite to the direction of the foregoing electric field. Taking notice of the characteristic of the dielectric material for inverting the direction of polarization, a technique has been developed to form a FRAM cell by employing a ferroelectric material to form an insulation film of an information storing capacitor of a memory cell.

The FRAM cell has a structure in which a ferroelectric capacitor is substituted for a capacitor of a DRAM cell. The FRAM employs a method in which a charge in a polarization switched or non-switched state is fetched from a ferroelectric capacitor through a switching MOS transistor. Thus, the FRAM has a characteristic that data "0" or "1" written and stored on a memory cell is not lost even if the operating power source is turned off. The FRAM has such a characteristic so that FRAM does not require a refreshing operation to store data and no electric power is required in a standby mode, as compared with the conventional Flash memory. Moreover, operation voltage for FRAM is about 5V much lower than the voltage of about 18V for the Flash memory, and power consume is reduced.

The FRAM cell includes a transistor-a capacitor (abbreviated to 1T/1C) structure composed of one transistor and one ferroelectric capacitor generally with a stacked structure. Referring to FIG. 1, a MOS transistor including a gate electrode 12, gate dielectric layer 14 and source/drain regions 16 is formed on a semiconductor substrate 10. An insulating layer 20 formed over the semiconductor substrate 10 has a contact plug 22 coupled to one of the source/drain regions 16. A horizontal stacked ferroelectric capacitor is formed on the contact plug 22. The conventional ferroelectric capacitor is formed in a way of horizontal stacking in a sequence from bottom to top. A lower electrode 24 is formed on the contact plug 22, and a ferroelectric film 26 and an upper electrode 28 is formed in sequence on the lower electrode 24. Substantially enough plate area is required for keeping capacitance of ferroelectric capacitor to prevent data loosing. As increasing integration of FRAM, the usage area of the FRAM cell is relatively decreased, and the fabricating area for ferroelectric capacitor is correspondingly decreased thereby resulting in a capacitance deficiency.

In addition, a horizontal ferroelectric capacitor is generally formed by utilizing deposited stack layer, and then defines the shape of the capacitor by lithographic and etching technology. However, during depositing conductive material for forming lower electrode, grain effect will be appeared in top portion of lower electrode and thus reducing electric conductivity. Furthermore, the edge of the ferroelectric capacitor will be damaged during the etching process, and thus a local leakage problem results.

SUMMARY OF THE INVENTION

The present invention provides a vertical ferroelectric capacitor structure and the method of fabricating the same, which can reduce the area for capacitor, increase the memory capacity of ferroelectric memory, and decrease grain effect and etching effect during fabricating process.

The present invention provides a ferroelectric capacitor structure adapted for a semiconductor substrate. The ferroelectric capacitor structure comprises two vertical plate electrodes and a ferroelectric layer between the two vertical plate electrodes. Wherein, the height of the vertical plate electrodes is larger than the thickness of the vertical plate electrodes, and the height of the vertical plate electrodes is also larger than the thickness of the ferroelectric layer.

The present invention also provides a method of fabricating a vertical ferroelectric capacitor. A semiconductor substrate is provided. An insulating layer having a first opening and a second opening is formed on the semiconductor substrate. The first and second openings are then filled with a conductive material to form a lower electrode and an upper electrode. A portion of the insulating layer is removed by lithographic and etching technology to form a gap between the lower and upper electrodes. The gap between the lower and upper electrodes is then filled with a ferroelectric material.

Since the lower and upper plate electrodes are in a vertical and a parallel arrangement, the area of the ferroelectric capacitor can be properly reduced by increasing the height of the ferroelectric capacitor. Accordingly, the amount of memory cells in the ferroelectric memory can be improved and thus increase the memory capacity. Moreover, the etching damage in the fabricating process also can be reduced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 2A:
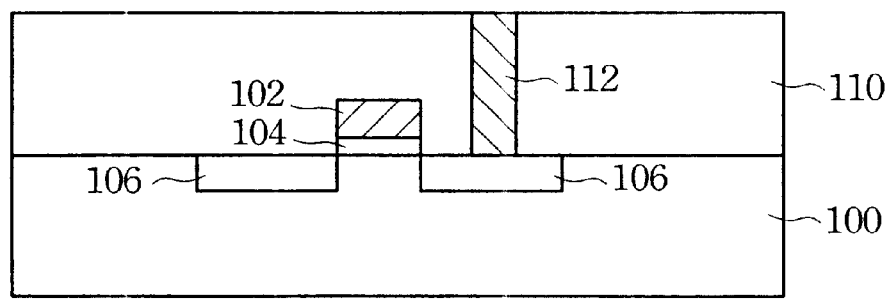
FIGS. 2A–2H are schematic cross-sectional views of fabricating a vertical ferroelectric capacitor according to the present invention.
Figure 2:
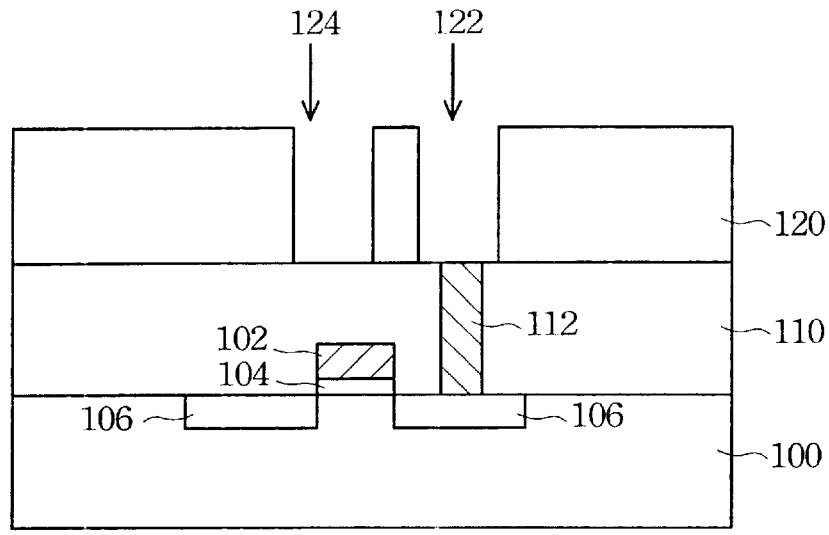
Figure 2:
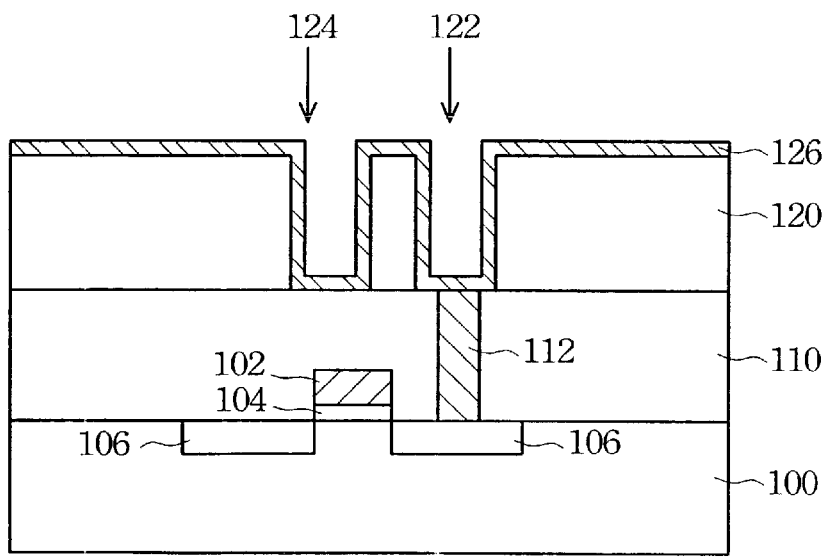
Figure 2:
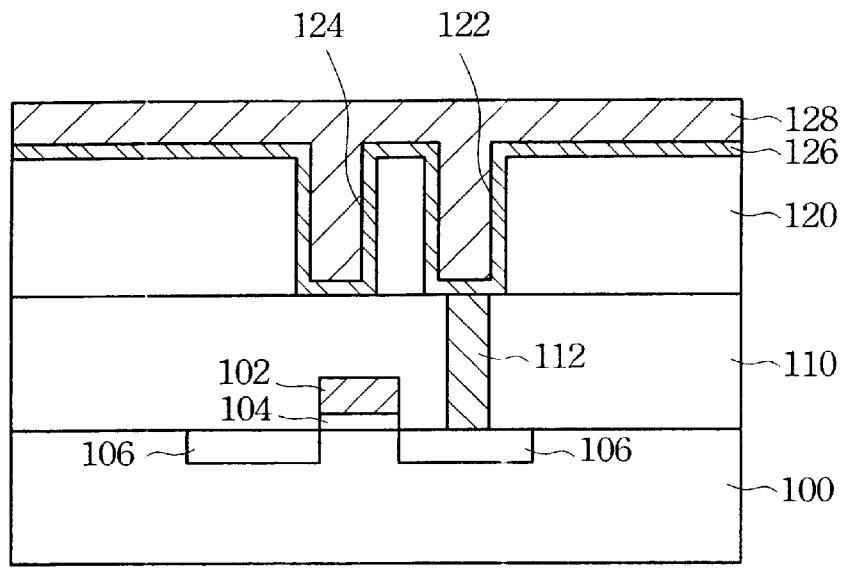
Figure 2:
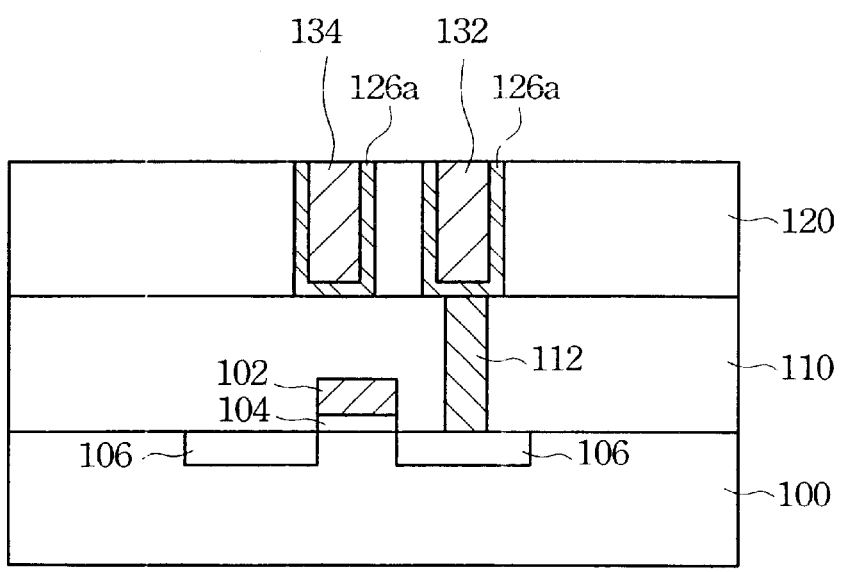
Figure 2:
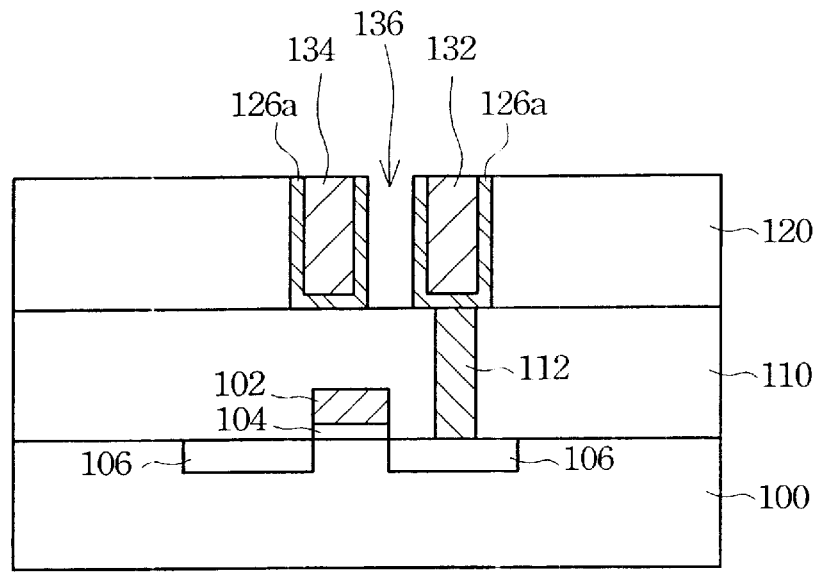
Figure 2:
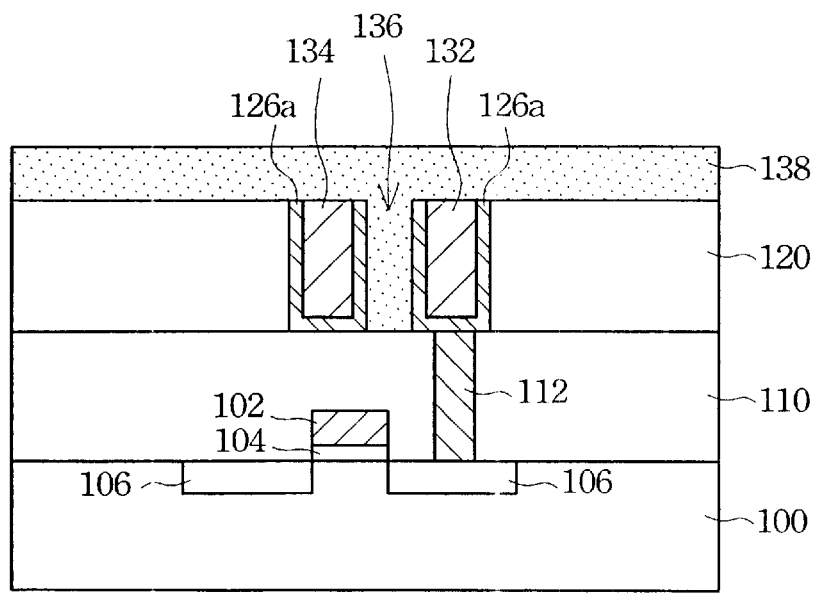

FIGS. 2A–2H are schematic cross-sectional views of fabricating a vertical ferroelectric capacitor of the present invention. Referring to FIG. 2A, a semiconductor substrate 100, such as a p-type silicon substrate with <100> lattice structure. A series of fabricating processes have been performed on the substrate 100. A MOS transistor including a gate 102, a gate dielectric layer 104, and source/drain regions 106 is formed on the active area of the substrate 100. A first insulating layer 110, such as silicon dioxide, spin-on-glass (SOG), low-k material, or the combination thereof, is formed over the substrate 100 to cover the MOS transistor. A contact plug 112 coupled to one of the source/drain regions 106 is formed in the insulating layer 110. A material of the contact plug 112 can be tungsten (W), polysilicon, or doped polysilicon, etc. The contact plug 112 can be formed in the following exemplary steps. A photoresist layer (not shown) is formed on the insulating layer 110, and then defined with desired pattern by lithographic technology. The exposed portion of the insulating layer 110 is etched by using the patterned photoresist layer as a mask to form a contact opening in the insulating layer 110. The photoresist layer is then removed. A conductive material such as tungsten is filled into the contact opening to form the contact plug 112.

Referring to FIG. 2B, a second insulating layer 120 composed of such as silicon dioxide, SOG, low-k material or the combination thereof is formed on the first insulating layer 110. A patterned photoresist layer (not shown) with desired pattern by lithographic technology is formed on the second insulating layer 120. The second insulating layer 120 is then etched by using the patterned photoresist layer as a mask to remove the exposed portion of the insulating layer 120, and thus to form a first opening 122 and a second opening 124, respectively called a lower electrode opening and an upper electrode opening, in the insulating layer 120. Wherein, the first opening 122, i.e. the lower opening, exposes the contact plug 112 in the bottom. The patterned photoresist layer is then removed. The aspect ratio of the first and second openings 122 and 124 is higher than 1.5:1, even higher than 10:1. The distance between the resulting first and second openings 122 and 124 is less than the depth of the first and second openings 122 and 124. If the thickness of the insulating layer 120 is about 7000–8000 angstroms, the distance between the first and second openings 122 and 124 can be about 200 angstroms. The higher aspect ratio and the shorter distance between the first and second openings 122 and 124, the area used for forming ferroelectric capacitor is fewer. However, the aspect ratio and the distance between the first and second openings 122 and 124 should be adjusted with the criticalness of each fabricating process.

Referring to FIG. 2C, a barrier layer 126, composed of such as titanium (Ti), titanium nitride (TiN) or tungsten (W), etc., is preferably formed on the sidewall and bottom to the first and second openings 122 and 124 before subsequently filled with a conductive material. The barrier layer 126, which conformal to the topology of the substrate 100, can be formed by chemical vapor deposition (CVD) or physical vapor deposition (PVD) technology to prevent moisture encroachment to the subsequently filled conductive material.

Referring to FIG. 2D, a layer of conductive material 128 is formed on the second insulating layer 120 and fills the first and second openings 122 and 124. The conductive material layer 128 can be composed of platinum (Pt), ruthenium (Ru), rhodium (Rh), or rhodium oxide, etc. Referring to FIG. 2E, a planariztion step is followed to remove a portion of the conductive material layer 128 and the barrier layer 126 on the insulating layer 120 by such as chemical mechanical polishing (CMP) or blanket etching technology to leave a portion of the conductive material layer 128 and barrier layer 126a in the first and second openings 122 and 124. The remaining conductive material in the first and second openings 122 and 124 are respectively formed a lower electrode 132 and an upper electrode 134. Wherein, the lower electrode 132 is electrically connected to the underlying source/drain region 106 of the MOS transistor through the contact plug 122 to be charged or discharged. Top portion of the lower and upper electrodes 132 and 134 can be optionally removed by blanket etching technology to be filled with a barrier layer the same as the barrier layer 126a and thus covering the whole lower and upper electrodes 132 and 134.

Referring to FIG. 2F, a portion of the insulating layer 120 between the lower and upper electrodes 132 and 134 is removed to form a gap 136 between the lower and upper electrodes 132 and 134. The gap 136 between the lower and upper electrodes 132 and 134 can be formed by lithographic and etching technology. A patterned photoresist layer (not shown) with a desired pattern is formed on the insulating layer 120. The exposed portion of the insulating layer 120 is etched by using the patterned photoresist layer as a mask to remove the portion of the insulating layer between the lower and upper electrodes 132 and 134 until exposing the underlying first insulating layer 110, and thus to form the gap 136.

Referring to FIG. 2G, a layer of ferroelectric material 138 is formed over the substrate 100 and fills the gap 136 between the lower and upper electrodes 132 and 134. The ferroelectric material layer 138 can be a material having a perovskite structure, such as lead zirconium titanate (PZT), barium strontium titanate (BST) or strontium bismuth tantalate (SBT), etc. by chemical vapor deposition (CVD) or metal organic chemical vapor deposition (MOCVD) technology. Since ferroelectric material is deposited and grew on both sidewalls and bottom of the gap 136, the lower and upper electrodes 132 and 134 will have preferred grain structure in the sidewall and bottom.

Figure 2H:
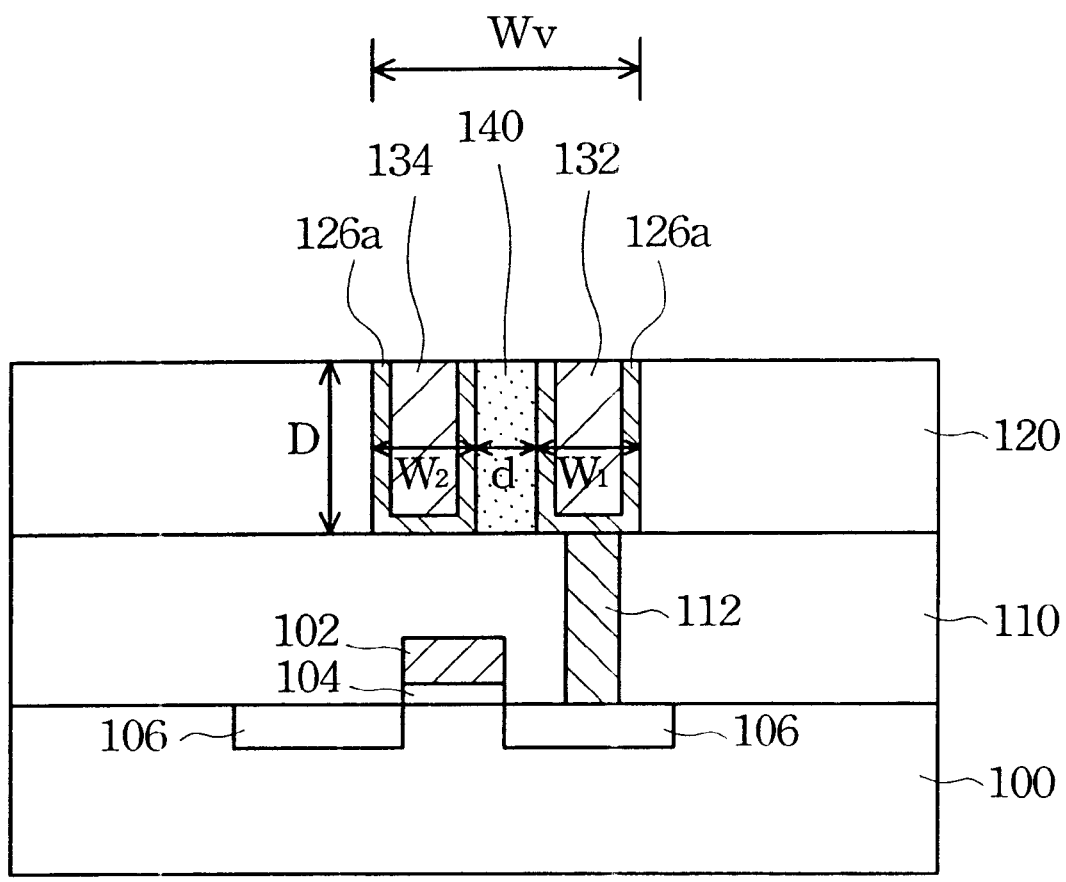

Referring to FIG. 2H, the needless portion of the ferroelectric layer 138 on the insulating layer 120 is removed by CMP or blanket etching technology to leave the remaining portion in the gap 136 to form a ferroelectric layer 140 of ferroelectric capacitor between the lower and upper electrodes 132 and 134. The following fabricating processes are well known to a person of ordinary skill in the art, and thus it is not necessary to explain further.

Figure 1:
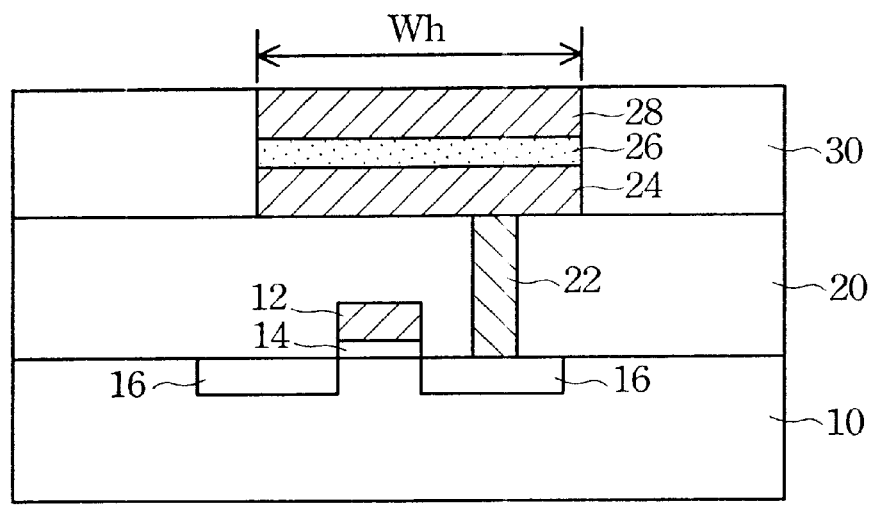
FIG. 1 shows a ferroelectric capacitor with a horizontal plate structure according to the prior art.

The vertical ferroelectric capacitor of the present invention comprises two vertical parallel plate electrodes (i.e. the lower electrode 132 and the upper electrode 134) and a ferroelectric layer 140 between the two vertical plate electrodes. The height D of the vertical plate electrodes is larger than the thickness W1, W2 of the vertical plate electrodes. Moreover, the height D is also larger than the thickness d of the ferroelectric layer 140. Referring to FIG. 2H and in view of FIG. 1, for the same capacitance, the ferroelectric capacitor with horizontal plate structure needs a capacitor width Wh, generally larger than 1 $\mu$m, in one unit length. In contrast, the vertical ferroelectric capacitor of the present invention just uses a capacitor width Wv less than 1 $\mu$m in one unit length. For 0.2 $\mu$m process technology, the thickness W1, W2 of the lower and upper electrodes 132 and 134 can be about 0.2–0.25 $\mu$m, and the thickness d of the ferroelectric layer can be about 0.2 $\mu$m. Accordingly, the capacitor width Wv of the present invention is about 0.75–0.8 $\mu$m in one unit length, and thus can reduce more than 20% of the used area. If 0.15 $\mu$m process technology is employed, the capacitor width Wv of the present invention can be further reduced. Therefore, the vertical ferroelectric capacitor of the present invention can obviously reduce the used area of the capacitor. For the same memory area, higher amount of the memory cells of the present invention can be formed, and the memory capacity can be thereby increased.

According to above description, the vertical ferroelectric capacitor of the present invention, it can reduce used area and increase memory capacity of the FRAM. Moreover, the grain structure of the ferroelectric layer of the present invention is better, and lower etching damage is presented.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of fabricating a vertical ferroelectric capacitor, comprising the steps of:
   providing a semiconductor substrate;
   forming an insulating layer with a first opening and a second opening on the semiconductor substrate;
   filling the first and second openings with a conductive material to form a lower electrode and an upper electrode;
   removing a portion of the insulating layer to form a gap between the lower and upper electrodes; and
   filling the gap between the lower and upper electrodes with a ferroelectric material.

2. The method according to claim 1, wherein the step of forming the first and second openings comprises:
   forming a patterned photoresist layer with a pattern of the first and second openings on the insulating layer;
   etching the insulating layer by using the patterned photoresist layer as a mask to form the first and second openings; and
   removing the patterned photoresist layer.

3. The method according to claim 1, wherein a distance between the first and second openings is shorter than the depth of the first and second openings.

4. The method according to claim 1, further comprising forming a conformal barrier layer on the sidewall and bottom of the first and second openings.

5. The method according to claim 4, wherein a material of the barrier layer comprises titanium.

6. The method according to claim 1, wherein the conductive material comprises platinum.

7. The method according to claim 1, wherein the step of filling the gap between the first and second openings with the conductive material comprises:
   forming a layer of conductive material on the insulating layer to fill the first and second openings; and
   removing a portion of the conductive material layer by chemical mechanic polishing technology to leave a remaining portion of the conductive material layer in the first and second openings.

8. The method according to claim 1, wherein the step of removing a portion of the insulating layer to form a gap between the lower and upper electrodes comprises:
   forming a patterned photoresist layer with a pattern of opening which exposes the insulating layer between the lower and upper electrodes on the semiconductor substrate;
   etching the exposed portion of the insulating layer by using the patterned photoresist layer as a mask; and
   removing the patterned photoresist layer.

9. The method according to claim 1, wherein the ferroelectric material comprises lead zirconium titanate (PZT).

10. A method of fabricating a ferroelectric memory cell, comprising the steps of:
    providing a semiconductor substrate having a transistor and a contact plug connected to the transistor;
    forming an insulating layer with a lower electrode opening and an upper electrode opening, wherein the lower electrode opening exposes the contact plug;
    filling the lower and upper electrode openings with a conductive material to form a lower electrode and an upper electrode;
    removing a portion of the insulating layer to form a gap between the lower and upper electrodes; and
    filling the gap between the lower and upper electrodes with a ferroelectric material.

11. The method according to claim 10, wherein a material of the contact plug comprises tungsten.

12. The method according to claim 10, wherein the step of forming the lower and upper electrode openings comprises:
    forming a patterned photoresist layer with a pattern of the lower and upper electrode openings on the insulating layer;
    etching the insulating layer by using the patterned photoresist layer as a mask to form the first and second openings; and
    removing the patterned photoresist layer.

13. The method according to claim 10, wherein a distance between the lower and upper electrode openings is shorter than the depth of the lower and upper electrode openings.

14. The method according to claim 10, further comprising forming a conformal barrier layer on the sidewall and bottom of the lower and upper openings.

15. The method according to claim 14, wherein a material of the barrier layer comprises titanium.

16. The method according to claim 10, wherein the conductive material comprises platinum.

17. The method according to claim 10, wherein the step of filling the gap between the first and second openings with the conductive material comprises:
    forming a layer of conductive material on the insulating layer to fill the lower and upper electrode openings; and
    removing a portion of the conductive material layer by chemical mechanic polishing technology to leave a remaining portion of the conductive material layer in the lower and upper electrode openings.

18. The method according to claim 10, wherein the step of removing a portion of the insulating layer to form a gap between the lower and upper electrodes comprises:
    forming a patterned photoresist layer with a pattern of opening which exposes the insulating layer between the lower and upper electrodes on the semiconductor substrate;
    etching the exposed portion of the insulating layer by using the patterned photoresist layer as a mask; and
    removing the patterned photoresist layer.

19. The method according to claim 10, wherein the ferroelectric material comprises lead zirconium titanate (PZT).

* * * * *